United States Patent [19]

Traynor

[11] 4,215,317
[45] Jul. 29, 1980

[54] COMPENSATED OPERATIONAL AMPLIFIER CIRCUIT

[75] Inventor: Robert J. Traynor, Tempe, Ariz.

[73] Assignee: Omni Spectra, Inc., Tempe, Ariz.

[21] Appl. No.: 964,259

[22] Filed: Nov. 27, 1978

[51] Int. Cl.² ............................ H03F 3/45; H03F 1/30
[52] U.S. Cl. ................................... 330/256; 330/260; 330/289
[58] Field of Search ..................... 330/9, 69, 256, 258, 330/260, 261, 289, 293

[56] References Cited

U.S. PATENT DOCUMENTS

| 3,701,036 | 10/1972 | Stefenel | 330/86 X |
| 3,753,139 | 8/1973 | Spencer | 330/289 X |

Primary Examiner—James B. Mullins
Attorney, Agent, or Firm—Joseph H. Roediger

[57] ABSTRACT

A thermal drift compensation circuit for operational amplifiers wherein a second operational amplifier is utilized to sense the error voltage between the input terminals of a first operational amplifier and generate a current therefor which compensates for errors resulting from thermal effects within the first operational amplifier.

14 Claims, 3 Drawing Figures

COMPENSATED OPERATIONAL AMPLIFIER CIRCUIT

BACKGROUND OF THE INVENTION

The invention relates to compensation circuits for substantially eliminating the output error voltages of operational amplifiers resulting from transient and thermal conditions occurring within the operational amplifier circuit.

An operational amplifier circuit includes a differentially connected pair of active semiconductor devices, typically transistors. Since the transistors normally do not have identical electrical and thermal characteristics, differences in their operating characteristics occur which give rise to errors in the output voltage. The error voltage in an operational amplifier is made up of components that relate to a number of different conditions. Among these sources of error voltage are transient currents, base drive current imbalances, thermal drift of the base-emitter voltages due to temperature changes of the semiconductor die resulting from thermal impedances and thermal time constants, and, in addition, base-emitter voltage changes due to changes in the collector currents of the differential pair. Furthermore, errors in operational amplifier performance can result from the unequal aging of the characteristics of the active devices of the amplifier circuit.

One important use of operational amplifiers is the translation of an input current into an output voltage. This output voltage varies within a given voltage range in order to drive voltage controlled oscillators. The voltage controlled oscillator (VCO) is a major building block of an increasing number of electronic systems and the failure to provide an accurate input signal thereto degrades the performance of the entire system. Since the internal changes in the active elements of the operational amplifier occur as a result of a multiplicity of factors some of which are nonlinear in behavior it has been found difficult to provide a compensation mechanism that will operate over a wide dynamic frequency and input signal range.

In the manufacture of operational amplifiers, it has been customary to utilize additional precision manufacturing steps including laser trimming of resistors in attempting to provide matching operation of the active semiconductor devices. Further, the production testing of fabricated operational amplifiers has included additional steps of temperature testing to identify those operational amplifiers exhibiting significant output error due to thermal characteristics. This invention is directed to a compensation circuit which when utilized with present operational amplifiers senses an error voltage within the amplifier and injects a compensating current therein. The use of this compensation circuit permits the manufacturer to reduce the number of steps involved in the manufacture and testing of the operational amplifier units. Thus, the costs of manufacture can be reduced and the performance characteristics are improved.

SUMMARY OF THE INVENTION

The present invention is directed to a compensated operational amplifier circuit wherein a first operational amplifier is provided with first and second input terminals with the second terminal being coupled to a reference potential and the first terminal receiving the input signal. The output terminal of the first amplifier circuit is coupled to one of the input terminals of the amplifier by a first impedance. The input terminals are referred to as the inverting and noninverting terminals and the feedback path is coupled to one of the input terminals as determined by the mode of operation desired. The first input terminal is coupled to the input signal source by an impedance and the ratio of these two impedances determines the generalized relationship of the input and output signals of the compensated operational amplifier circuit.

A second operational amplifier having first and second input terminals and an output terminal is provided in the compensated amplifier circuit. The output terminal of the second amplifier is coupled by a second impedance to one of the input terminals of the first amplifier. The second amplifier generates a compensating current for the first amplifier and this current is supplied through the second impedance to the first operational amplifier.

The first input terminal of the second amplifier is coupled, preferably by an impedance included for current limiting purposes, to that input terminal of the first amplifier coupled to the output terminal of the second amplifier. The second input terminal of the second amplifier is coupled to the reference potential. As a result, the error voltage between the input terminals of the first amplifier is sensed by the second amplifier and a compensating current is supplied to one of the input terminals of the first amplifier. The compensating current provided by the second amplifier is determined in part by the amplifier gain which operates on the voltage level sensed at the first input terminal of the first amplifier. This gain is determined by a fourth impedance coupling the input terminal of the second amplifier to the reference potential in combination with a third impedance coupling the output terminal of the second amplifier to the fourth impedance.

In operation, the error voltage between the input terminals of the first operational amplifier is sensed by the second operational amplifier which serves as a current generator to supply a compensating current to the first amplifier input terminal. The required magnitude of the compensation current is determined in part by the operational characteristics of the first amplifier. This current is generated by the second operational amplifier with the magnitude of the second, third and fourth impedances determining the gain of the second amplifier and the current generated therefrom. In the event that no error voltage is present between the input terminals of the first amplifier, no compensating current is supplied by the second amplifier.

Further features and advantages of the invention will become more readily apparent from the following detailed description of a specific embodiment when taken in conjunction with the accompanying drawings.

DETAILED DESCRIPTION OF A PREFERRED EMBODIMENT

Figure 1:
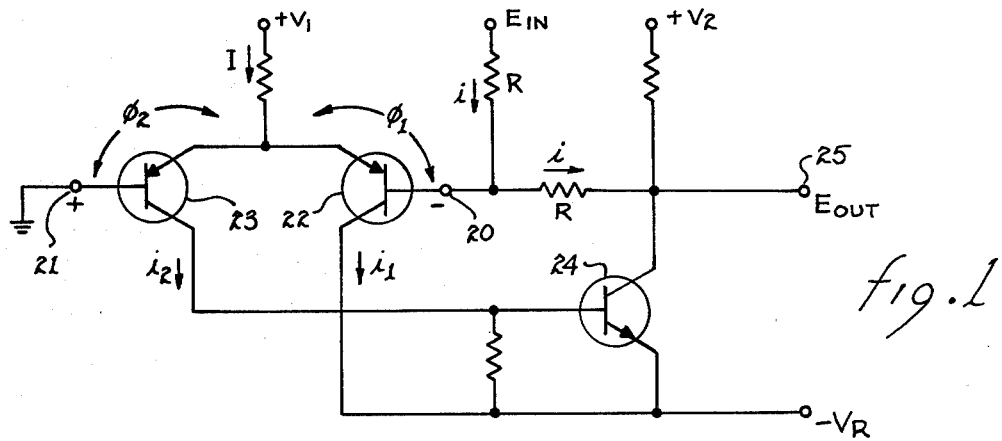
FIG. 1 is an electrical schematic diagram of an operational amplifier utilized as an inverting amplifier.

Referring now to FIG. 1, an operational amplifier circuit is shown connected in the inverting mode with the input signal $E_{in}$ being coupled to the inverting input terminal 20. The non-inverting input terminal 21 is coupled to a reference potential. A pair of transistors 22 and 23 are connected as a differential pair with the emitters of the pair being coupled to a current source providing current I. The base electrodes are connected to the input terminals and the collector electrodes are coupled to the base and emitter electrodes of current sink transistor 24.

In operation, the transistors 22 and 23 exhibit base-emitter voltage drops $\phi_1$ and $\phi_2$ respectively which are determined by the currents $i_1$ and $i_2$ flowing therethrough and the temperature characteristics of the semiconductor material. In practice, the transistors are not exactly matched in performance characteristics with the result that $\phi_1$ is unequal to $\phi_2$ and an undesired voltage appears at terminal 20. Terminal 21 is connected to a reference potential (ground) while terminal 20 has the error voltage causing it to be at some potential other than ground. This error voltage is generated in a nonlinear manner in accordance with a logarithmic equation wherein the base-emitter voltage of a transistor is a function of the temperature and the current therethrough.

The presence of this error voltage in an uncompensated operational amplifier circuit results in an inaccurate output voltage at terminal 25. The operational amplifier circuit of FIG. 1 is shown as a unity gain inverting circuit wherein the ratio of the input signal $E_{in}$ to the output signal $E_{out}$ is minus one. In this embodiment, the error voltage $\phi_1 - \phi_2$ appearing at terminal 20 has been found to result in an output error voltage approximately twice that amount at terminal 25.

The output error voltage is a function of the closed loop gain of the operational amplifier and is approximately equal to the product of the error voltage ($\Delta\phi$) and the closed loop gain plus one. The following discussion relates to a unity gain amplifier although the discussion applies as well to operational amplifiers having gains other than unity.

Since the output error voltage varies with the internal temperature characteristics of the semiconductor material in a nonlinear manner over a period of time, the ability of opertional amplifiers to drive high speed voltage controlled oscillators with stable voltages is greatly impaired and the amplifier exhibits post-tuning drift. In addition, the linearity of the operational amplifier response is decreased and the settling time required for the output voltage to reach a final level is increased. These undesired results increase in severity for operational amplifiers being utilized at high frequencies.

The present invention is shown in the block schematic diagram of FIG. 2 wherein the operational amplifier 10 contains a differential pair of transistors as described in connection with FIG. 1 and is subject to the thermal stresses, unequal collector current sharing and error voltage problems mentioned previously. The non-inverting input terminal is labeled + with the inverting input terminal labeled −. As shown, the operational amplifier 10 is connected in the inverting mode with the input signal $E_{in}$ being coupled to the − input terminal and the + terminal being coupled to ground. However, it should be noted that the invention is not limited to a particular mode of amplifier operation nor to any particular gain that is designed for in a given application.

The amplifier 10 has an error voltage $\epsilon$ due to the internal characteristics existing between its input terminals. Without compensation, the error voltage causes an output error voltage at output terminal 14. The desired performance characteristic for amplifier 10 is to have the ratio of $E_{out}$ to $E_{in}$ determined by the ratio of the magnitudes of $R_2$ and $R_1$. For the purposes of this discussion, $R_1$ and $R_2$ are equal which corresponds to the unity gain application.

Upon the application of the input voltage $E_{in}$ to terminal 12, an error voltage $\epsilon$ is present at node 15. This voltage is applied at the non-inverting input terminal of second operational amplifier 11 via current limiting resistor $R_4$. This input voltage to amplifier 11 is utilized to generate a compensating current $i_c$ which is supplied to node 15 from the output of operational amplifier 11 through resistor $R_3$. The current generating portion of the invention provides a compensating current at the inverting input terminal of amplifier 10 which is utilized to compensate for the presence of error voltage $\epsilon$. As voltage $\epsilon$ changes during operation, the compensating current injected at node 15 changes accordingly.

The compensating current required for a unity gain circuit has been found to be the error voltage divided by the sum of resistors $R_1$ and $R_2$, which in this case are of equal magnitude. This is due to the change, either increase or decrease, in current $i_1$ and current $i_2$ of FIG. 2 caused by node 15 differing from the ground potential by error voltage $\epsilon$. Therefore, the gain of amplifier 11 and the magnitude of $R_3$ are selected to provide the compensation current $i_c$ to node 15. In the case of a gain of +3 for amplifier 11 with resistor $R_3$ having a magnitude equal to $R_1 = R_2$, $i_c = (3\epsilon - \epsilon) \div R_3$. For a gain of +2 for amplifier 11, the resistor $R_3$ has a value of $R_12 = R_22$ and $i_c = (2\epsilon - \epsilon) \div R_12$ or $2\epsilon/R$. It is recognized that different combinations of gain and resistor values can be utilized to inject the compensating current ($\epsilon/R_1 + \epsilon/R_2$). The foregoing discussion has not considered the input current requirements of an operational amplifier; which in theory have an infinite impedance and in practice do utilize a small current. However, the current required is not significant.

The gain of the operational amplifier 11 is determined by resistors $R_5$ and $R_6$ with $R_6$ being made twice $R_5$ for the +3 gain embodiment. The resistor $R_4$ through which the current requirement of amplifier 11 is supplied does not control the magnitude of current $i_c$ and it is typically selected to be equal in magnitude to the parallel combination of resistors $R_5$ and $R_6$. Further, the input voltages to amplifiers 10 and 11 are typically different by two orders of magnitude so that the magnitude of any uncompensated error in operational amplifier 11 is normally less than one-onehundredth that of amplifier 10.

Thus, the uncompensated error voltage at the output terminal of the second operational amplifier is one of relatively constant and typical low magnitude and not normally significant in overall circuit performance. In particular embodiments of the invention wherein the effect of the output error voltage of the second operational amplifier is to be reduced, the resistor $R_3$ is made adjustable to permit the magnitude of current $i_c$ to be varied to provide either overcompensation or undercompensation depending upon the particular application of the invention.

Figure 2:
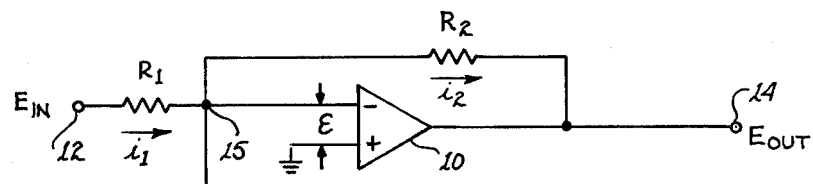
FIG. 2 is a block schematic diagram of a compensated inverting operational amplifier circuit in accordance with the present invention.

In operation, the circuit of FIG. 2 has a voltage $E_{in}$ applied to input terminal 12 and a current $i_1$ is supplied to node 15. The voltage at output terminal 14 changes to $E_{out}$ which, for the ideal condition, is an inverse multiple of $E_{in}$. However, the ideal condition wherein node 15 is at virtual ground is not normally attained and node 15 is at a voltage $\epsilon$. A multiple or other function of this error voltage depending on the desired transfer function of amplifier 10 appears at terminal 14 without compensation being provided. However, a compensating current is injected at node 15 to essentially eliminate the effects of the error voltage $\epsilon$. Although the discussion refers to the injection of a compensating current into node 15, the polarity of the error voltage $\epsilon$ at the input terminal of amplifier determines the polarity of the compensating current required to be generated by amplifier 11.

The error voltage $\epsilon$ at node 15 is sensed by operational amplifier 11. The gain of this amplifier results in an output voltage which is a multiple of voltage $\epsilon$ and as a result a current $i_c$ flows through resistor $R_3$. The current flow to node 15 is the sum of current $i_c$ less a small input current to amplifier 11 and compensates for the reductions in the magnitudes of currents $i_1$ and $i_2$ due to node 15 being at a voltage other than ground. As previously mentioned, the gain of amplifier 11 and the magnitude of resistor $R_3$ are selected to provide the required level for current $i_c$. In practice, the gain of amplifier 11 is preferably designed to be low and resistor $R_3$ minimized to improve the frequency response for applications wherein the input signal $E_{in}$ has a high slew rate. Also, the effect of the input current to amplifier 11 can be substantially eliminated by providing a variable resistor $R_3$ and trimming or adjusting this resistor to compensate therefor.

As mentioned, the block schematic diagram of FIG. 2 is an inverting operational amplifier circuit containing the compensation circuit. In embodiments wherein noninverting operation of the first operational amplifier is the intended mode of operation, the input voltage $E_{in}$ is coupled to the noninverting (+) terminal of the amplifier via resistor $R_1$ and the second terminal of the compensating operational amplifier is coupled to this noninverting terminal for its reference potential. The inverting (−) terminal of the first terminal is coupled to the output terminals of both the first and second operational amplifiers similar to that shown in FIG. 2. Both input terminals of the first amplifier are coupled via corresponding resistors to a reference potential in this mode of operation. The compensation circuit operates in the same manner for either mode by sensing the error voltage between the input terminals of the first amplifier and generating a compensating current which is injected back into the inverting input terminal of the first operational amplifier similar to that shown in FIG. 2.

Figure 3:
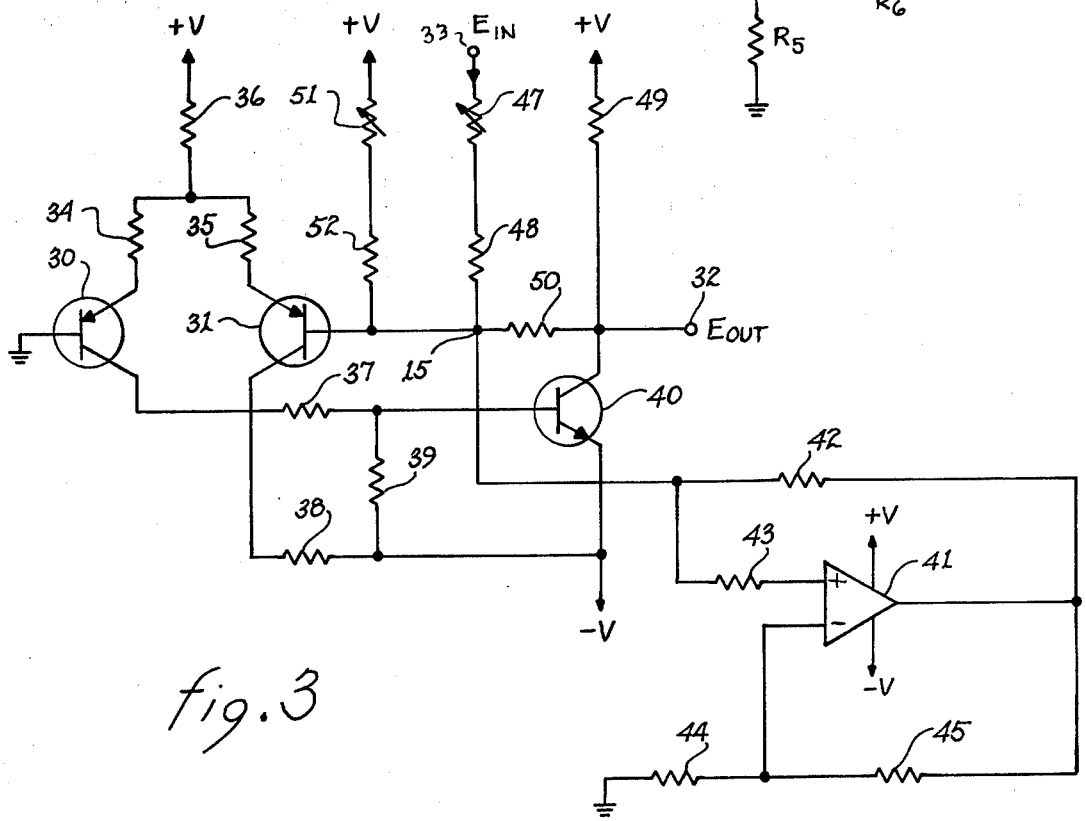
FIG. 3 is an electrical schematic diagram of one embodiment of the present invention.

One particular embodiment of the invention utilized as a unity gain inverting drive circuit for a voltage controlled oscillator wherein the input voltage to the drive circuit has a range of 0 to +10 volts and the output voltage range is 0 to −10 volts is shown in FIG. 3. The first operational amplifier includes a differentially connected pair of transistors 30, 31 with their emitters coupled via resistors 34, 35 respectively to resistor 36 and to supply voltage +V.

The collectors of transistors 30, 31 are coupled via resistors 37, 38 respectively to the base and emitter electrodes of transistor 40. In addition, current balancing resistor 39 is connected between the base and emitter of transistor 40 with the emitter thereof being coupled to supply voltage −V. These elements are contained within the block operational amplifier 10 of FIG. 2, although other types of operational amplifier circuits can be utilized if desired. For example, amplifier circuits having current limiting base electrode resistors may be employed. In addition, in applications wherein the base currents are to be further reduced, field effect transistors may be utilized in the operational amplifier circuits.

The base electrode of transistor 31 is coupled to the non-inverting input terminal of operational amplifier 41 by resistor 43. The inverting terminal is coupled to ground by resistor 44 and to the amplifier output by resistor 45. In addition, the amplifier output is coupled to the node 15 to which it provides the compensating current through resistor 42.

The input voltage $E_{in}$ is applied to input terminal 33 which is connected to node 15 by gain adjustment resistor 47 and fixed resistor 48. In addition, node 15 is connected via resistor 50 to output terminal 32. The collector of transistor 40 is coupled to the output terminal 32 and via resistor 49 to the supply voltage +V to determine the limits for the output voltage range. In addition, a d.c. level adjustment is provided which includes fixed resistor 52 and variable resistor 51 coupled between node 15 and supply voltage +V. This combination permits a variable d.c. current to be injected into node 15 if desired. Also, resistor 42 can be made adjustable to vary the magnitude of the compensating current $i_c$ to permit controlled variation of the output voltage $E_o$ if desired.

The component values utilized in the embodiment of FIG. 3 are as follows:
Resistors 34, 35, 37, 38: 10 ohms
Resistors 36, 48: 430 ohms
Resistor 39: 100 ohms
Resistors 49, 42: 330 ohms
Resistors 50, 52: 390 ohms
Resistor 44: 410 ohms
Resistor 45: 820 ohms
Resistor 43: 270 ohms
IC 41: Harris 2520 series While the above description has referred to a specific embodiment of the invention it is recognized that variations and modifications may be made therein without departing from the scope of the invention.

What is claimed is:

1. A compensated operational amplifier circuit which comprises:
   (a) a first operational amplifier having first and second input terminals and an output terminal;
   (b) means for coupling the first input terminal to an input signal source;
   (c) a first impedance coupled between the output terminal of said first amplifier and one of said input terminals;
   (d) means for coupling the second input terminal of said amplifier to a reference potential; and
   (e) current generating means coupled between said first input terminal and the reference potential for sensing the internal voltage difference of said first operational amplifier therebetween and supplying a compensating current to one of said input terminals which is a function of said voltage difference.

2. The circuit in accordance with claim 1 wherein said current generating means comprises:
   (a) a second operational amplifier having first and second input terminals and an output terminal;

(b) first means for coupling the first input terminal of said second amplifier to the first input terminal of said first amplifier;

(c) second means for coupling the second input terminal of said second amplifier to the second input terminal of said first amplifier; and (d) a second impedance coupled between the output terminal of said second amplifier and one of said input terminals of said first amplifier whereby a compensating current is supplied thereto.

3. The circuit in accordance with claim 2 further comprising:

(a) a third impedance coupled between the output terminal and the second input terminal of said second amplifier.

4. The circuit in accordance with claim 3 wherein said second means for coupling includes a fourth impedance, said third and fourth impedances determining the gain of the second operational amplifier.

5. The circuit in accordance with claim 4 wherein said second operational amplifier has a gain greater than unity.

6. The circuit in accordance with claim 5 wherein said first means for coupling includes a current-limiting resistance.

7. The circuit in accordance with claim 5 wherein said second impedance is variable to enable the magnitude of said compensating current to be varied in response thereto.

8. The circuit in accordance with claim 7 wherein the first and second input terminals of the second operational amplifier are the noninverting and inverting terminals respectively.

9. A compensated noninverting operational amplifier circuit in accordance with claim 8 wherein the first and second input terminals of the first operational amplifier are the noninverting and inverting terminals respectively.

10. A compensated inverting operational amplifier circuit in accordance with claim 8 wherein the first and second input terminals of the first operational amplifier are the inverting and noninverting terminals respectively.

11. A compensation circuit for a first operational amplifier having first and second input terminals and an output terminal, said compensation circuit comprising:

(a) a second operational amplifier having first and second input terminals and an output terminal;

(b) means for sensing the internal voltage difference between the first and second input terminals of said first operational amplifier and applying said voltage difference between the first and second input terminals of said second operational amplifier;

(c) impedance means coupled between the output terminal of said second amplifier and the first input terminal of said first amplifier for supplying a compensating current thereto.

12. The compensation circuit of claim 11 wherein said second operational amplifier has a gain greater than unity.

13. The compensation circuit of claim 12 wherein said impedance means is variable to enable the magnitude of the compensating current to be varied in response thereto.

14. The compensation circuit of claim 11 wherein said first and second input terminals are the noninverting and the inverting terminals respectively of the second operational amplifier and further comprising a first resistance coupled between the output terminal and second input terminal and a second resistance coupled between said second input terminal and the second input terminal of the first operational amplifier.

* * * * *

UNITED STATES PATENT OFFICE
CERTIFICATE OF CORRECTION

Patent No. 4,215,317     Dated 07/29/80

Inventor(s)    Robert J. Traynor

It is certified that error appears in the above-identified patent and that said Letters Patent are hereby corrected as shown below:

Column 4, line 38, change "$R_12$" two occurrences -$R_1/2$-.

Column 4, line 38, change "$R_22$" to -$R_2/2$-.

Signed and Sealed this

Twenty-eighth Day of October 1980

[SEAL]

Attest:

SIDNEY A. DIAMOND

Attesting Officer    Commissioner of Patents and Trademarks